US008679316B2

(12) United States Patent
Brunner et al.

(10) Patent No.: US 8,679,316 B2
(45) Date of Patent: Mar. 25, 2014

(54) AQUEOUS, ACID BATH AND METHOD FOR THE ELECTROLYTIC DEPOSITION OF COPPER

(75) Inventors: Heiko Brunner, Berlin (DE); Bernd Roelfs, Berlin (DE); Dirk Rohde, Berlin (DE); Thomas Pliet, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 542 days.

(21) Appl. No.: 12/921,817

(22) PCT Filed: Apr. 27, 2009

(86) PCT No.: PCT/EP2009/003353
§ 371 (c)(1),
(2), (4) Date: Sep. 10, 2010

(87) PCT Pub. No.: WO2009/132861
PCT Pub. Date: Nov. 5, 2009

(65) Prior Publication Data
US 2011/0011746 A1  Jan. 20, 2011

(30) Foreign Application Priority Data
Apr. 28, 2008 (EP) .................. EP08008111

(51) Int. Cl.
*C25D 5/02* (2006.01)
*C25D 3/38* (2006.01)
(52) U.S. Cl.
USPC ............ 205/123; 205/118; 205/125; 205/296
(58) Field of Classification Search
USPC .................... 205/118, 123, 125, 296
See application file for complete search history.

(56) References Cited

U.S. PATENT DOCUMENTS

| 2,564,092 A | * | 8/1951 | Bersworth ............... 562/565 |
| 2,876,178 A | | 3/1959 | McCoy |
| 3,111,465 A | | 11/1963 | Passal |
| 5,215,645 A | | 6/1993 | DiFranco et al. |
| 5,972,192 A | | 10/1999 | Dubin et al. |
| 6,261,433 B1 | | 7/2001 | Landau |
| 2002/0195351 A1 | | 12/2002 | Lu et al. |
| 2004/0188263 A1 | | 9/2004 | Sugimoto et al. |
| 2005/0072683 A1 | * | 4/2005 | Nakada et al. ........... 205/296 |
| 2006/0052287 A1 | * | 3/2006 | Patt ........................... 514/6 |

FOREIGN PATENT DOCUMENTS

| DE | 2739427 A1 | 3/1978 |
| DE | 3236545 A1 | 5/1983 |
| DE | 3624481 A1 | 1/1988 |
| DE | 4225961 C2 | 2/1994 |
| GB | 1107198 | 3/1968 |
| WO | WO 2005014891 A2 * | 2/2005 ............. C23D 3/38 |

OTHER PUBLICATIONS

Kinstler et al., "Mono-N-Terminal Poly(ethylene glycol)-Protein Conjugates", Advanced Drug Delivery Reviews (no month, 2002), vol. 54, pp. 477-485.*

(Continued)

*Primary Examiner* — Edna Wong
(74) *Attorney, Agent, or Firm* — Paul & Paul (57) ABSTRACT

An aqueous, acid bath for the electrolytic deposition of copper contains at least one copper ion source, at least one acid ion source, at least one brightener compound, and at least one leveler compound, and generates a very uniform copper deposit in particular in blind micro vias (BMVs) and trenches. The leveler compound is selected from among synthetically produced non-functionalized peptides, synthetically produced functionalized peptides, and synthetically produced functionalized amino acids.

18 Claims, 6 Drawing Sheets

(56) References Cited

OTHER PUBLICATIONS

P.M. Vereecken et al.:"The Chemistry of additives in damascene copper plating", IBM J. Res. & Dev., vol. 49 (Jan. 2005), No. 1, 3-18.
F. Albericio "Developments in peptide and amide synthesis", Current Opinion in Chemical Biology 8 (2004) 211-221.
F.M. Veronese "Peptide and protein PEGylation: a review of problems and solutions", Biomaterials 22 (2001) 405-417.
Ko Takehara and Yasushi Ide electrochemistry of copper (II)-peptide complexes containing histidine residues Inorganica Chimica Acta, vol. 183, No. 2, May 15, 1991 pp. 195-202 XP 002568102.
Bilewicz et al "The reduction of Cu(II) complexes of histidine and histidyl peptides at mercury electrodes", Journal of Electroanalytical Chemestry and Interfacialelectro Chemistry, Elsevier, Amsterdam, NL, vol. 267, No. 1-2 Aug. 1989 pp. 231-241 XP026532900.

* cited by examiner

AQUEOUS, ACID BATH AND METHOD FOR THE ELECTROLYTIC DEPOSITION OF COPPER

FIELD OF THE INVENTION

The invention relates to an aqueous, acid bath and to a method for the electrolytic deposition of copper, in particular for filling blind micro vias (BMVs), through vias, trenches and similar structures on printed circuit boards, chip carriers and semiconductor wafers.

BACKGROUND OF THE INVENTION

Adding numerous different organic additives to acid electrolytic copper baths is known in order to enable the decorative and functional characteristics of the copper coatings to be controlled. Above all, brighteners and carriers are added to the baths in order to obtain bright deposits. In addition, organic compounds are used as additives to the coppering baths during the production of printed circuit boards, chip carriers and semiconductor wafers, and these compounds are to act as levelers and enable as uniform a deposition of copper as possible in and on different regions of the surface of the printed circuit board or of the structure of the printed circuit board, e.g., the trenches or the BMVs.

The uniform deposition of copper is often difficult in view of the geometric arrangement and development of the individual regions, in particular in trenches, BMVs or through vias, as these regions exhibit a variable electric depositing behaviour. In particular, in very small structures of this type (in the medium to lower µm range), influences of the diffusion of the metal ions and of the additives towards the deposition location are dominant. A uniform deposition of copper is the prerequisite for the development of complex conductor structures. Otherwise, the result can be insufficient or excessive deposition, for example, at the walls of the through vias, leading to their uselessness and consequently to the rejection of the entire printed circuit board or chip carrier. The same result is produced by insufficient and non-uniform metallisation of the trenches and BMVs on printed circuit boards, chip carriers and wafers, as in very small structures that are to be completely filled by the metal, hollow spaces (voids) form in the copper deposit or the structures can be reproduced on the surface after the coppering process due to unevenness. This makes additional operating steps and material costs necessary for building up subsequent layers and problems can arise due to impedance fluctuations that are no longer tolerable.

U.S. Pat. No. 2,876,178 describes an alkaline cyanide copper bath in which amino acids or secondary amino acid derivatives, such as peptones and peptides, are contained. These additives are said to have advantageous effects on the copper depositing process.

U.S. Pat. No. 5,215,645 describes a copper bath for the electrolytic forming of a copper foil to be used in the construction of a printed circuit board. The copper bath contains gelatine compounds along with other additives. These types of compounds are described as high-polymer proteins of amino acids with a molecular weight of from 10,000 to 300,000. According to the introduction to the description in this document, gelatine additives are used to control the roughness of the deposited copper layers. In addition, an active sulfur compound, preferably thiourea, is contained in order to limit the roughness of the deposited copper.

US 2004/0188263 A1 also describes the generation of a copper foil for the production of printed circuit boards by means of a copper bath. The bath used for this purpose contains, among other things, glue, gelatine and collagen peptide. The copper foil formed makes it easier to drill holes through the copper foil with a laser when producing printed circuit boards without requiring an auxiliary nickel metal layer for example.

The production of more efficient integrated circuits for IC chips also requires the use of more efficient copper depositing baths with corresponding bath additives, some of the above-mentioned requirements having an even greater importance. P. M. Vereecken et al.: "The chemistry of additives in damascene copper plating", IBM J. Res. & Dev., Vol. 49 (Jan. 2005), No. 1, 3-18, describes compositions containing, for example, polyether, sulfur-based organic compounds and levelers, such as thiourea, benzotriazole (BTA) and Janus Green B (JGB), with which mirror-like copper surfaces can be generated and which enable accelerated copper deposition in the finest trenches.

US 2002/0195351 A1 discloses a composition for the electrolytic deposition of copper onto integrated circuits, for example in narrow trenches for conductor paths or conductor path connections (vias). The composition contains, along with other additives, sulfur containing amino acids as polishing means, for example, cysteine, percysteine, glutathione and the derivatives and salts thereof.

U.S. Pat. No. 5,972,192 discloses a method of electroplating Cu to reliably fill openings in a dielectric layer, particularly high aspect ratio openings for contacts, vias and/or trenches. An electroplating solution is employed which comprises a leveling agent and optionally a brightening agent. The leveling agent can be selected from polyethyleneimine, polygylcine, 2-amino-1-naphthalinesulfonic acid, 3-amino-1-propanesulfonic acid, 4-aminotoluene-2-sulfonic acid and further compounds. A suitable brightening agent may be 2,5-dimercapto-1,3,4-thiodiazol.

U.S. Pat. No. 6,261,433 B1 discloses an electrochemical deposition method which is used for copper electrodeposition on semiconductor substrates. An electroplating solution is used which may include, i.a., dipeptide diaminoacid, diglycine and triglycine.

With the progressive miniaturisation of printed circuit boards or the design of printed circuit boards and wafers becoming ever more complex, with the aim, among other things, of providing greater calculating capacities and/or functionalities in an ever decreasing space, the industry is always facing new challenges. At the same time, the geometry, for example of the printed circuit boards or respectively of the conductor path structures and of the conductor structures on printed circuit boards, chip carriers and semiconductor wafers is becoming more and more complicated. For example, the ratio of the copper thickness to the width of a conductor path or respectively of the hole depth relative to the diameter of the hole (aspect ratio) is constantly becoming greater as the hole diameters are becoming smaller and smaller and the conductor paths narrower and narrower.

In particular, it has been shown that the uniformity of the metal deposition on printed circuit boards, chip carriers and semiconductor wafers using the known methods is insufficient to guarantee reliable generation of the conductor structures in trenches and vias. Due to the structures becoming smaller and smaller, a copper layer with an uneven surface is formed as the copper is being deposited. The result of this in damascene methods for the generation of conductor structures is that a reliable result for chemical/mechanical polishing can no longer be achieved without having to do more. For it is a prerequisite condition for this method step that the copper surfaces generated during the electrolytic deposition process be extensively smooth and even so that metal can be removed in a reliable manner up to the desired depth. In addition, it is clear that the desired effects do not occur with the necessary reproducibility.

To meet these requirements, there is a need for bath solutions for the accurate uniform deposition of copper, where this effect is supplied in a reproducible manner. In particular, the requirement is for bath solutions that are suitable to fill trenches and BMVs in such a manner that the formed conductor structures exhibit a uniform distribution of layer thickness and good conductivity, that the formed conductor paths, therefore, do not have a so-called ski slope shape (concave shape of the copper surface in cross-section corresponding to the rounding of a ski tip) or any other concave structures either and the BMVs do not have a so-called dimple shape (depression of the copper surface at the point of the via). At the same time, the filling characteristics of the bath solutions, such as in particular micro-throwing, must not be impaired.

The aforementioned requirements cannot be met by the previously known bath solutions. In particular, it is not possible to achieve a uniform distribution of layer thickness with the deposited copper in particular in trenches and BMVs and, in any case, this cannot be achieved in a reproducible manner.

Consequently, the problem on which the present invention is based is that the known bath solutions are not suitable to fill micro structures of through holes, trenches and BMVs with sufficient precision in a uniform manner, i.e., with a copper surface that is as even as possible. Consequently, it is the object of the present invention to solve this problem and, over and above this, to guarantee that the aforementioned requirements are constantly achievable even under the conditions of mass production.

In particular, micro structures, such as through holes, trenches and BMVs, on printed circuit boards, chip carriers and semiconductor wafers, are to be filled in such a manner that there are no disadvantageous effects, such as ski-slopes and dimples, and that an even surface with uniform layer thickness is produced overall.

SUMMARY OF THE INVENTION

This object is achieved through an aqueous, acid bath for the electrolytic deposition of copper, said bath containing at least one copper ion source, at least one acid ion source, at least one brightener compound and at least one leveler compound, wherein at least one leveler compound is selected from the group comprising synthetically produced non-functionalized peptides, synthetically produced functionalized amino acids and synthetically produced functionalized peptides.

Preferably, the at least one leveler compound does not comprise diglycine, triglycine, polyglycine and carnosine (beta-alanyl-L-histidine).

This object is additionally achieved through a method for the electrolytic deposition of copper on a work piece, said method comprising the following method steps: (i) providing the aqueous, acid bath according to the invention for the electrolytic deposition of copper as well as at least one anode, (ii) bringing the work piece and at least one anode into contact with the aqueous, acid bath according to the invention and (iii) generating an electric current flow between the work piece and at least one anode so that copper is deposited on the work piece. This is accomplished in that the work piece and at least one anode are connected to a current or respectively voltage source.

The aqueous, acid bath according to the invention and the method according to the invention are preferably used for the electrolytic coating of printed circuit boards, chip carriers and semiconductor wafers or also of any other circuit carriers and are used in particular in semiconductor wafers, but also in printed circuit boards and chip carriers, to fill trenches, blind micro vias, through vias (through holes) and similar structures with copper.

In so far as the term "amino acid" is used in this description and in the claims, it refers to a compound that has at least one amino group and at least one carboxyl group. This includes both proteinogenic amino acids (α-amino carboxylic acids) and non proteinogenic amino acids. The amino acids can occur independently of one another in an S- or L-configuration. The following amino acids, among others, can occur: alanine, arginine, asparagine, asparagine acid, cysteine, glutamic acid, glutamine, glycine, histidine, isoleucine, leucine, lysine, methionine, phenylalanine, proline, serine, threonine, tryptophan, tyrosine and valine. In addition, the amino acids can also be derivatized, in particular methylised independently of one another, or for example can support protective groups. For the present invention, however no compound that has a peptide-(NH—CO)-bond in the molecule is referred to as amino acid.

In so far as the term "peptide" is used in this description and in the claims, it refers to a straight-chain or branch-chain (star-shaped also) amino acid chain with at least two amino acid units, which are interlinked via a peptide-(NH—CO)-bond. The amino acids can occur in the chain in any sequence, configuration and frequency. In so far as the term "non-functionalized peptide" is used in the description and in the claims, it refers to a peptide that is not functionalized with a polyalkylene glycol radical or with a polyalkylene imine radical or with a polyvinyl alcohol radical or with any other radical. In so far as the term "functionalized peptide" or "functionalized amino acid" is used in the description and in the claims, it refers to a peptide or respectively an amino acid to which is bonded a radical that has an effect with regard to the leveler compound, for example an improved leveling effect and/or an increase in solubility of the leveler compound in the aqueous, acid bath.

In so far as the term "oligopeptide" is used in this description and in the claims, it refers to a peptide that consists of up to ten amino acids, which are interlinked via peptide bonds. Consequently, the term oligopeptides encompasses in particular dipeptides, tripeptides and tetrapeptides, but also higher peptide homologues. Oligopeptides are distinguished, from polypeptides by the chain length: Peptides that are up to 10 amino acids long are oligopeptides, whereas peptides that are more than 10 amino acids long are polypeptides.

In so far as the term "polypeptide" is used in this description and in the claims, it refers to a peptide that consists of from ten to, for example, 100 amino acids that are interlinked via peptide bonds.

Peptides can be produced according to recognized methods of chemistry and those skilled in the art are familiar with these types of production methods. According to the invention, the non-functionalized peptides and functionalized peptides and functionalized amino acids are produced by synthesis. These types of methods are well known in the art (see for example F. Alberricio, "Developments in peptide and amide synthesis", Current Opinion in Chemical Biology 8 (2004) 211-221). In this respect, the contents of this publication are included by reference in the present disclosure.

In so far as the term "alkyl" is used in this description and in the claims, it refers to a hydrocarbon radical with the general chemical formula $C_nH_{2n+1}$, n being an integer from 1 to about 50. $C_1$-$C_8$, for example, includes, among others, methyl, ethyl, n-propyl, iso-propyl, n-butyl, iso-butyl, Cert-butyl, n-pentyl, iso-pentyl, sec-pentyl, tert-pentyl, neo-pentyl, hexyl, heptyl and octyl. Alkyl can be substituted by replacing an H-atom in each case by a functional group, for example OH, Hal (F, Cl, Br, I), CHO, COOH and COOR, amongst others.

In so far as the term "aryl" is used in this description and in the claims, it refers to ring-shaped aromatic hydrocarbon radical, for example phenyl or naphtyl, where individual ring carbon atoms can be replaced by N, O and/or S, for example benzthiazolyl. Over and above this, aryl can be substituted by replacing an H-atom in each case by a functional group, for example OH, Hal (F, Cl, Br, I), CHO, COOH and COOR, amongst others.

In so far as the term "brightener" is used in this description and in the claims, it refers to substances that exert a brightening and accelerating effect during the copper deposition process. These are generally organic compounds, in particular organic compounds containing sulfur, preferably organic thiols, organic sulfides, organic disulfides or organic polysulfides, for example aliphatic thiols, sulfides, disulfides and polysulfides. The brightener compounds may also be organic, e.g., aliphatic, araliphatic or aryl, compounds having a C=S moiety. So that these compounds have sufficient solubility in the aqueous, acid bath, they each preferably contain at least one polar group additionally, for example one or two sulfonic acid groups or respectively salt groups thereof. Further, the brightener compounds preferably do not contain amino groups.

In so far as the term "carrier" is used in this description and in the claims, it refers to substances that exert an effect that promotes the copper deposition process. These are generally organic compounds, in particular high-molecular compounds that contain oxygen, preferably polyalkylene glycol compounds.

BRIEF DESCRIPTION OF THE DRAWINGS

Figs. 1a, 1b, 1b1, and 1b2 show a test layout for a printed circuit board that has been used to carry out the tests.

DETAILED DESCRIPTION OF THE INVENTION

Interestingly, it has been shown that non-functionalized amino acids have no leveling effect. If synthetically produced peptides or respectively the synthetically produced functionalized peptides and synthetically produced functionalized amino acids are used in place of amino acids, a completely different behaviour, surprisingly, occurs. In this case, depending on the chain length and the type of amino acid in the peptides, a leveling effect to the point of filling in blind micro vias and similar structures is observed. The peptides and amino acids have an even better leveling function when they are linked to a polymer chain comprising PEG, PPG/PEG or polyethylene imine or comprising polyvinyl alcohol. Characteristics can then be varied selectively through the intermediary of the chain length and also the chain type. The production of adducts from peptides and PEG and their positive effect in therapeutic and biotechnological applications is described, for example, by F. M. Veronese ("Peptide and protein PEGylation: a review of problems and solutions", Biomaterials 22 (2001) 405-417). In this respect, the contents of this publication are included by reference in the present disclosure.

Using the aqueous, acid bath according to the invention and the method according to the invention, it is possible to deposit copper in a very uniform manner in depressions with very small structural dimensions with structural widths of approximately 50 μm and smaller, for example in trenches and BMVs. In particular it is possible to fill these depressions totally and not have any voids. This guarantees that an extensively smooth, even copper surface is formed that exhibits practically no deformations. For example, dimples are hardly ever to be seen in the area of BMVs, and a non-uniform shape of the conductor structures in trenches in the form of a ski slope is completely eliminated, such that an ideal or almost ideal rectangular shape is produced in the cross-section of the conductor structure. This is achieved by the copper being deposited in the trenches with an even surface.

In contrast to the known baths for the electrolytic deposition of copper, for example the baths made described in U.S. Pat. Nos. 2,876,178, 5,215,645 and US 2004/0188263 A1, where additives obtained from animal products are used (for example, hydrolysis products from collagen, gel forming albuminoids, fibroids, keratins (U.S. Pat. No. 2,876,178), gelatine, usually obtained from animal bone glue (U.S. Pat. No. 5,215,645), glue, gelatine or collagen peptide (US 2004/0188263 A1)), the aqueous, acid bath according to the invention contains synthetically produced non-functionalized peptides and/or synthetically produced functionalized peptides and/or synthetically produced functionalized amino acids. Synthetically produced substances have a well-defined substance identity and composition, whereas the additives in the known baths are mixtures of various compounds. Their identity and composition are hardly known and consequently are undefined. In particular, depending on the methods of production or respectively the methods of preparation as well as source for these substances, substances with different compositions can be produced, for example even in different batches. As, depending on constitution and composition, the individual substances additionally have different characteristics and possibly are inactive with regard to the desired effects or even have negative characteristics, their efficiency can vary considerably in dependence on the production method and on the type of raw substances used and they can even have effects that are completely undesirable.

By the non-functionalized peptides and functionalized peptides and functionalized amino acids being produced synthetically, this problem does not arise. Namely by producing consistent (uniform) compounds, clearly defined efficiency is obtained.

In addition, the desired efficiency is only obtained if both, the synthetically produced peptides and/or the synthetically produced functionalized peptides and/or the synthetically produced functionalized amino acids and at least one brightener compound, are contained in the depositing bath. It is only the interaction between the peptides or respectively amino acids and the brightener that produces the desired effect. Irrespective of the fact that the deposition bath in US 2002/0195351 A1 does not include non-functionalized peptides or functionalized peptides or functionalized amino acids, but rather specific amino acids, namely amino acids containing sulfur that are non-functionalized, the deposition bath in US 2002/0195351 A1 does not have a brightener compound either. Consequently, this bath does not have the desired characteristics.

The peptides and amino acids are preferably functionalized with polyalkylene glycol groups and/or with polyalkylene imine groups and/or with polyvinyl alcohol radicals.

It is particularly preferred when the peptides are oligopeptides. These types of compounds preferably contain 2-10, more preferred 2-4 amino acid units. These types of compounds, in particular, are suitable to produce the desired effect. More particularly preferred are dipeptides and possibly tripeptides and tetrapeptides. Mixtures of these compounds can also be contained in the aqueous, acid bath according to the invention. A particularly preferred dipeptide is $NH_2$-Gly-Leu-OH.

Non-functionalized and functionalized peptides are also preferred, where an end amino acid that is selected from the group comprising leucine, isoleucine, methionine, phenylalanine, tryptophan, asparagine, glutamine, thyrosine, lysine, arginine and histidine is located at the C terminus.

Also preferred are non-functionalized and functionalized peptides according to the present invention that contain at least one beta-amino acid selected from the group comprising beta-alanine, beta-phenylalanine, beta-tryptophan, beta-thyrosine, beta-leucine, beta-isoleucine, beta-glutamine, beta-glutamic acid, beta-histidine, beta-methionine and asparagine acid.

The abovementioned compounds exhibit moderate BMV fill characteristics. In contrast to conventional levelers, these compounds cause a smaller ski-slope than conventional levelers. This effect can be used in order to influence the line shape (surface profile) selectively in a bath according to the invention without impairing the BMV filling.

In addition, according to the invention there are levelers in which the peptides and amino acids are functionalized with polyalkylene glycol groups and/or with polyalkylene imine groups and/or with polyvinyl alcohol radicals.

Preferred polyalkylene glycol groups and polyalkylene imine groups are radicals that have the general chemical formula —$(X—CHR—CH_2)_n$—R', wherein X is O or NH, R is H or methyl, each X and each R in a $(X—CHR—CH_2)$ moiety can be selected independently of each X and R in another $(X—CHR—CH_2)$ moiety, n is an integer from 2 to 1000 and R' is H, alkyl or aryl. R' is preferably H. When R' is alkyl, alkyl can be in particular $C_1$-$C_8$-alkyl. When R' is aryl, aryl can be in particular $C_5$-$C_{12}$-aryl (only the number of the aromatic ring carbon atoms being specified).

It is additionally advantageous when —$(X—CHR—CH_2)_n$—R' is selected from the group comprising homo-polyethylene glycol radicals, homo polypropylene glycol radicals, homo polyethylene imine radicals and copolymer radicals comprising at least two units, selected from the group comprising ethylene glycol units, propylene glycol units and ethylene imine units. In particular, the copolymer radicals can be alternating, statistic, gradient, block and graft copolymer radicals. In particular preferred are block copolymer radicals that contain ethylene glycol units and propylene glycol units.

For example, —$(X—CHR—CH_2)_n$—R' can represent the following radicals: —$(O—CH_2—CH_2)_n$—H, —$(O—CH(CH_3)—CH_2)_n$—H, —$(N—CH_2—CH_2)_n$—H, —$(N—CH(CH_3)—CH_2)_n$—H.

The radical —$(X—CHR—CH_2)$—R' can have a mean molecular weight of 300-35,000 Dalton, preferably from 800 to 15,000 Dalton. n is preferably in a range of from about 20 to about 500.

Amino acids and/or peptides with polyvinyl alcohol radicals can preferably be formed through reaction of polyvinyl alcohol with amino acids and/or peptides.

The concentration of all the leveler compounds together in the bath according to the invention is preferably at least 0.01 mg/l, particularly preferred at least 0.1 mg/l and most preferred at least 0.2 mg/l. The leveler concentration is preferably not exceeding 1000 mg/l, particularly preferred not exceeding 10 mg/l and most preferred not exceeding 2 mg/l. These values for the lower limit and for the higher limit can be combined together in an arbitrary manner.

The aqueous, acid bath according to the invention also additionally contains at least one brightener compound. In particular, the aqueous, acid bath according to the invention can contain at least one brightener compound that is selected from the group comprising organic compounds that contain sulfur. More preferred is at least one brightener compound that is selected from the group comprising organic thiol compounds, organic sulfide compounds, organic disulfide compounds and organic polysulfide compounds. Most preferred is at least one brightener compound that is selected from the group comprising 3-(benzthiazolyl-2-thio)-propyl sulfonic acid, 3-mercapto-propane-1-sulfonic acid, ethylene dithiodipropyl sulfonic acid, bis-(p-sulfophenyl)-disulfide, bis-(ω-sulfobutyl)-disulfide, bis-(ω-sulfohydroxypropyl)-disulfide, bis-(ω-sulfopropyl)-disulfide, bis-(ω-sulfopropyl)-sulfide, methyl-(ω-sulfopropyl)-disulfide, methyl-(ω-sulfopropyl)-trisulfide, O-ethyl-dithio carbonic acid-S-(ω-sulfopropyl)-ester, thioglycol acid, thiophosphoric acid-O-ethyl-bis-(ω-sulfopropyl)-ester, thiophosphoric acid-tris-(ω-sulfopropyl)-ester and the salts thereof.

The concentration of all the brightener compounds together in the aqueous, acid bath according to the invention is preferably at least 0.01 mg/l, more preferred at least 0.05 mg/l and most preferred at least 0.1 mg/l. The brightener concentration is preferably not exceeding 100 mg/l, particularly preferred not exceeding 10 mg/l and most preferred not exceeding 2 mg/l. These values for the lower limit and for the higher limit can be combined together in an arbitrary manner.

In addition, the aqueous, acid bath according to the invention can contain additionally at least one carrier substance. These types of compounds can be, for example, high-molecular compounds containing oxygen. These are preferably polyalkylene glycol compounds, for example a polyalkylene glycol or an acid ester, in particular a carboxylic acid ester of a polyalkylene glycol or an ether from a polyalkylene glycol and from one or more alcohols, such as an alkanol ether or a phenol ether of a polyalkylene glycol. These types of additive are for example: polyvinyl alcohol, carboxymethyl cellulose, polyethylene glycol, polypropylene glycol, stearic acid polyglycol ester, oleic acid polyglycol ester, stearic alcohol polyglycol ether, nonylphenol polyglycol ether, octanol polyalkylene glycol ether, octane diol-bis-(polyalkylene glycol ether), poly(ethylene glycol-ran-propylene glycol), poly(ethylene glycol)-block-poly(propylene glycol)-block-poly(ethylene glycol), poly(propylene glycol)-block-poly(ethylene glycol)-block-poly(propylene glycol). The concentration of these compounds is preferably at least approximately 0.005 g/l, particularly preferred at least approximately 0.01 mg/l. The concentration does not exceed approximately 20 g/l, more preferred it does not exceed approximately 5 g/l. These values for the lower limit and for the higher limit can be combined together in an arbitrary manner.

The copper bath contains a copper ion source, for example copper sulfate, and in addition a compound that increases the electrical conductivity of the bath, for example sulfuric acid, as an acid ion source and can usually contain a chloride. This basic composition of the bath can be broadly varied. In general, an aqueous solution with the following composition is used: copper sulfate ($CuSO_4.5H_2O$): 20 to 250 g/l, preferably 60 to 80 g/l or 180 to 220 g/l; sulfuric acid: 50 to 350 g/l, preferably 180 to 220 g/l or 50 to 90 g/l; chloride ions: 0.01 to 0.18 g/l, preferably 0.03 to 0.10 g/l.

Other copper salts can also be used at least partially in place of copper sulfate as the copper ion source. The sulfuric acid can also be replaced partially or completely by fluoroboric acid, methane sulfonic acid or other acids. The chloride ions are added as alkali chloride (for example sodium chloride) or in the form of hydrochloric acid. The addition of sodium chloride can be omitted completely or partially when halide ions are already contained in the additives.

In addition, conventional surfactants or other conventional additives can be contained in the bath.

To produce the bath, the additional substances and other additives are added to the basic composition. The operating conditions of the bath are preferably as follows: pH value: 0 to 3; temperature: 15° C.-50° C., particularly preferred 15° C.-40° C.; cathodic current density: 0.5-12 A/dm$^2$, particularly preferred 0.7-7 A/dm$^2$ (average current density).

The deposition bath can be moved in particular by a strong inflow and, where applicable, by clean air being blown in, such that the surface of the bath undergoes strong movement. This means that the substance transport is maximised in the vicinity of the cathodes and anodes so that a greater current density is made possible. Movement of the cathodes also improves the material transport at the respective surfaces. In addition, convection can also be produced in the bath by rotating the work piece, for example a semiconductor wafer, at a relatively high speed in the bath so that there is a pull of the liquid towards its surface. Constant diffusion-controlled deposition is achieved by means of the increased convection and electrode movement. The work piece can be moved in a horizontal and vertical manner and/or by means of vibration. A combination with the air blown into the deposition bath is particularly effective.

The copper consumed during the deposition process can be supplemented electrochemically via copper anodes. For example, copper with a content of 0.02 to 0.067 percent by weight phosphorus can be used for the anodes. They can be suspended directly in the electrolyte or can be used in the form of balls or pellets and be filled into titanium baskets located in the bath for this purpose.

Insoluble anodes can be used as an alternative. These types of anodes are inert during the depositing process and consequently do not change their shape. This enables a time-constant geometry during the depositing process. In particular precious metals, such as platinum or also so-called valve metals such as titanium, coated with mixed oxides of precious metals, for example with a coating of ruthenium oxide and iridium oxide, can be used as insoluble anodes. The insoluble anodes can be in the form of expanded metal. In order to obtain a supplement of copper ions when using insoluble anodes, a copper compound can be dissolved in the bath, or metallic copper is brought into contact with the aqueous, acid copper bath according to the invention. This metal dissolves under the action of oxygen dissolved in the bath or with the help of compounds that form the oxidised form of a redox system, for example with the help of Fe(III)-ions dissolved in the bath which are thereby reduced to Fe(II)-ions. The Fe(II)-ions are oxidised at the insoluble anode back to Fe(III)-ions. The Fe(II)/Fe(III)-ions can originate, for example, from the corresponding iron sulfate salt. The concentration of Fe(II)-ions is preferably 8-12 g/l and that of the Fe(III)-ions is preferably 1-5 g/l.

In place of a direct current (DC) method, the coppering can also be carried out using a pulsed current. These types of pulsed current methods include unipolar pulsed current methods, where the depositing current is regularly interrupted and there are pauses in the current between the depositing pulses, and reverse pulse plating, where the current is reversed at times at the work piece during the plating process, i.e., switched anodically. The reverse pulse plating method was developed for the electrolytic deposition in particular of copper on circuit boards with a high aspect ratio and is described, for example, in DE 42 25 961 C2 and DE 27 39 427 A1. Where higher current densities are used, improved surface distribution and throwing power is achieved in the through holes.

Copper can be deposited both in the conventional manner, by immersing the work piece into a deposition bath that is located in an immersion bath container and polarising the work piece in relation to an anode that is located in the same bath, and also by a horizontal depositing method. The latter depositing methods are carried out in conveyorized horizontal apparatus, through which the work pieces are conveyed in the horizontal position and direction of transport, at the same time being brought into contact with the deposition bath. The anodes are also disposed in a horizontal position in the apparatus along the transport path for the work pieces. These types of apparatus are disclosed, for example, in DE 36 24 481 A1 and DE 32 36 545 A1. In addition, semiconductor wafers are preferably treated in so-called cup-platers, in which a respective wafer is disposed in the horizontal position above an anode that is also disposed in the horizontal position. The cup-plater is filled with the deposition bath. Consequently, both the wafer and the anode are in contact with the deposition bath. The wafer rotates during the depositing process.

Figure 1A:
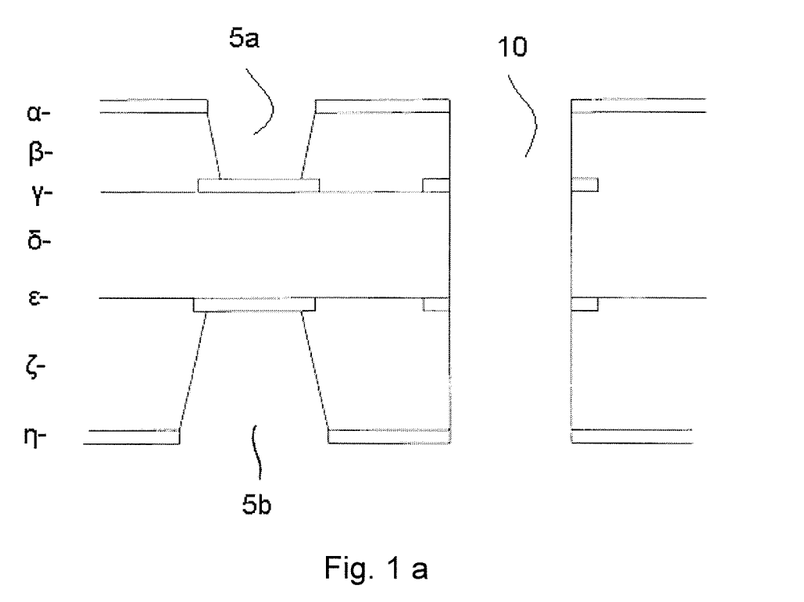
Figure 1B:
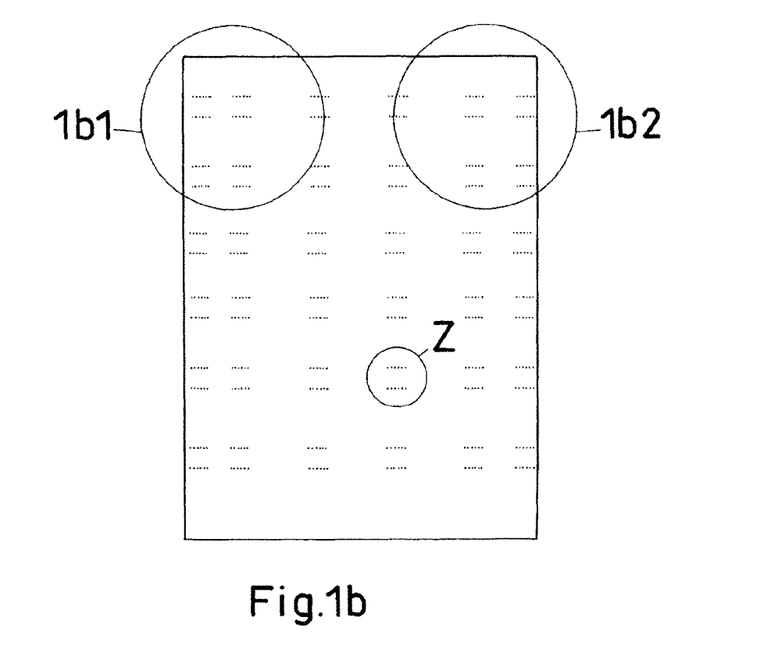
Figure 1B:
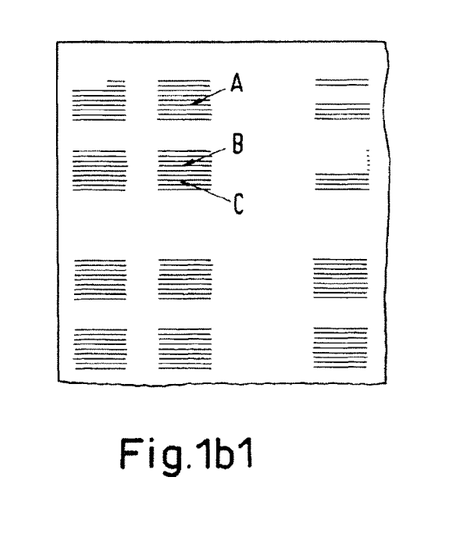
Figure 1B:
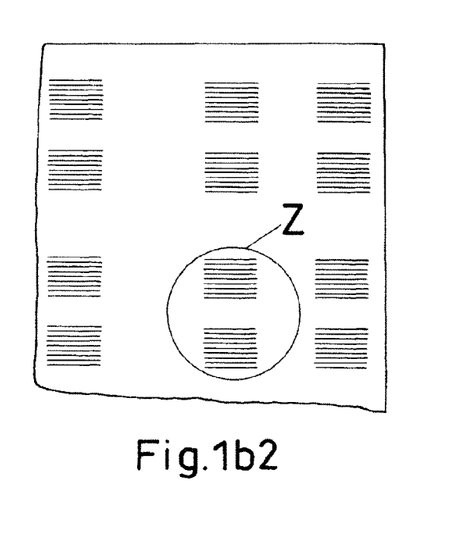
Figure 2:
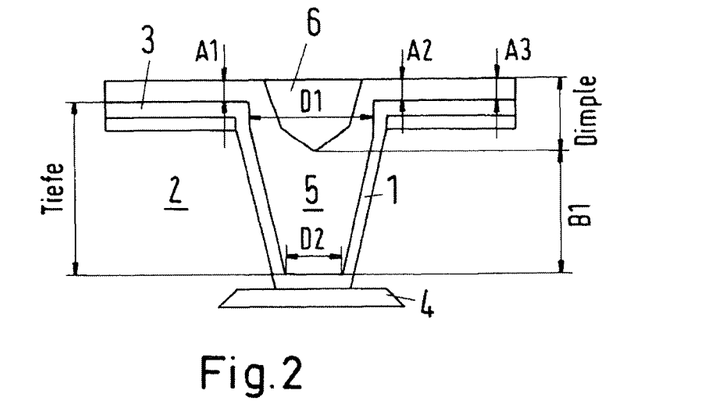
FIG. 2 shows a schematic cross-sectional representation of a BMV filled with copper, showing a dimple.
Figure 3:
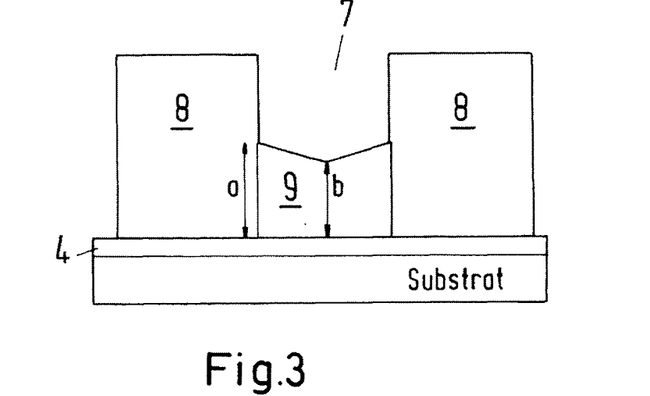
FIG. 3 shows a schematic cross-sectional representation of a trench filled with copper in a photoresist.
Figure 4:
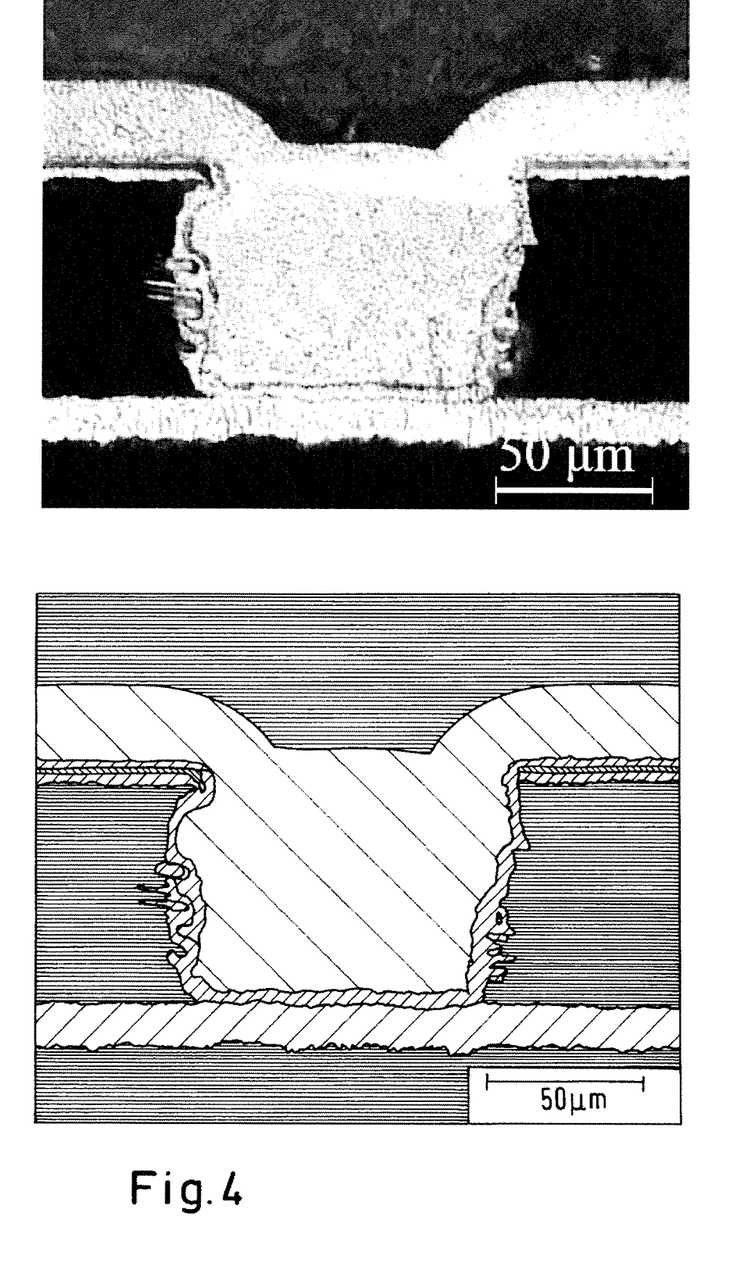
FIG. 4 shows a cross-sectional photograph through a BMV that is filled with copper.
Figure 5:
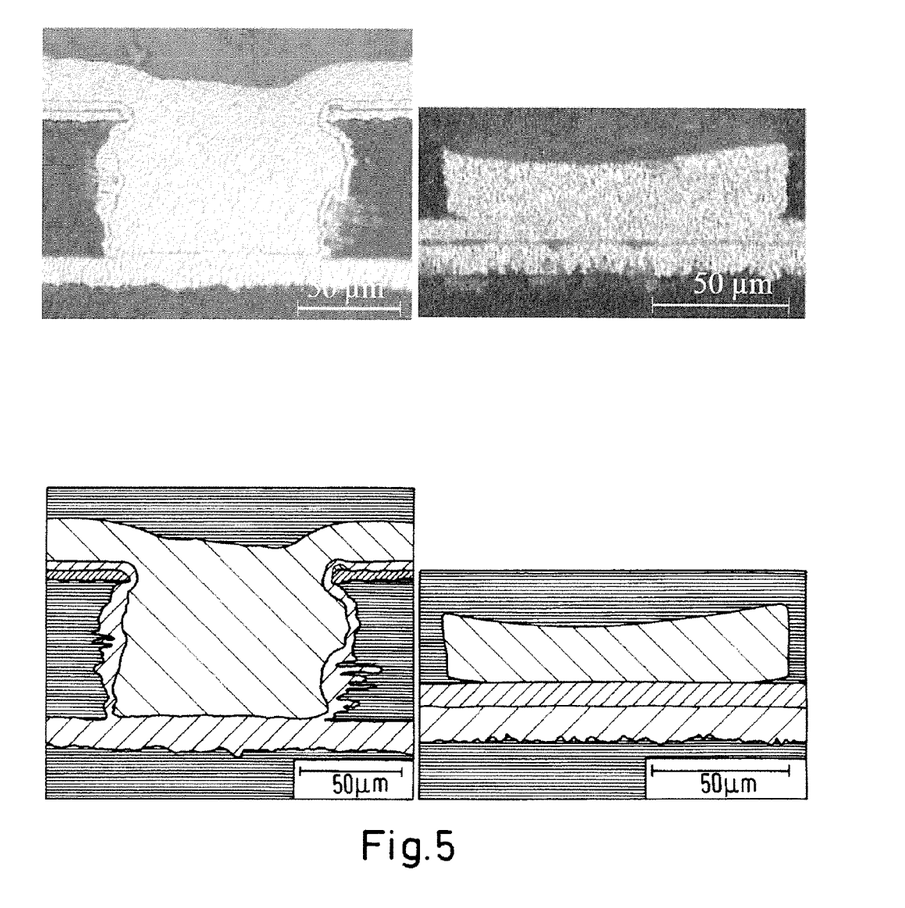
FIG. 5 shows a filled BMV and a filled trench (comparative test).
Figure 6:
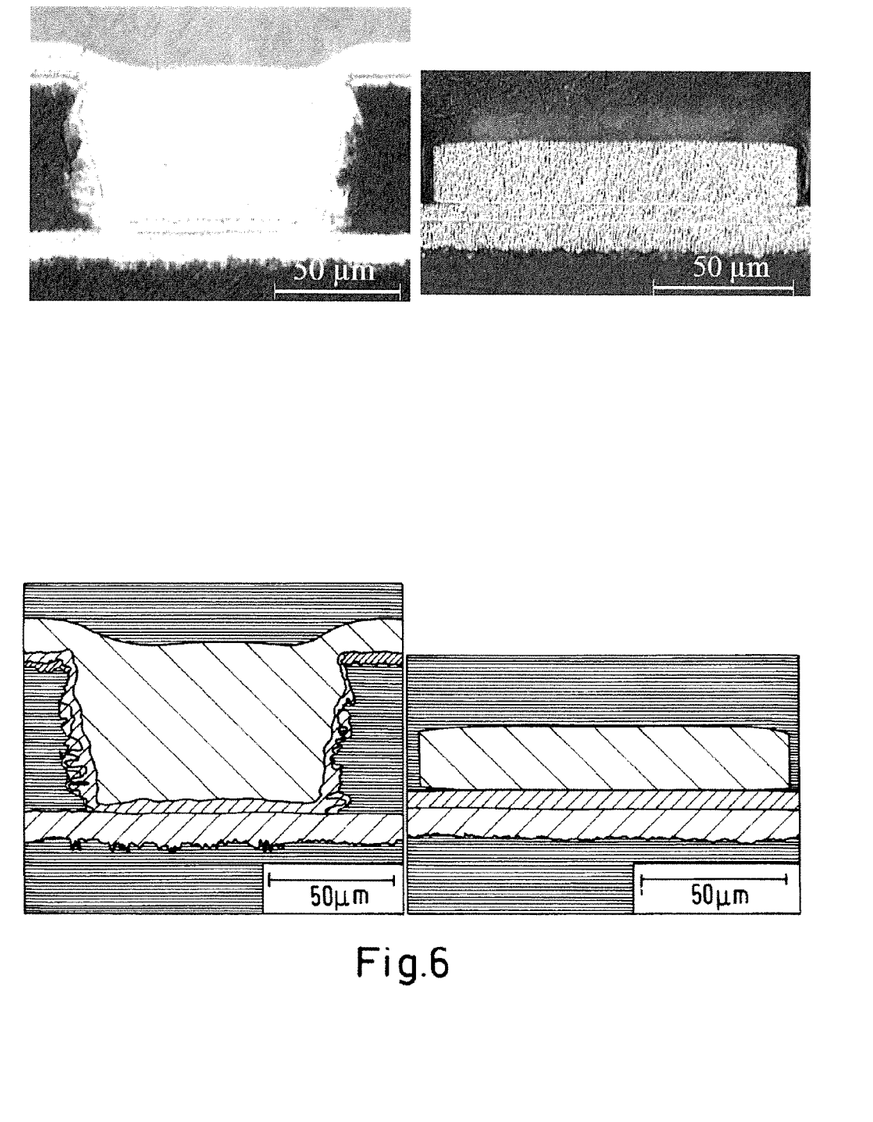
FIG. 6 shows a filled BMV and a filled trench (test according to the invention).

The following examples and comparative examples are used to explain the invention:

FIG. 1 shows a test layout for a printed circuit board that has been used to carry out the tests: FIG. 1a: board design, FIG. 1b: hole pattern (with FIG. 1b1: upper left-hand corner of the layout and FIG. 1b2: upper right-hand corner of the layout);

FIG. 2 shows a schematic cross-sectional representation of a BMV filled with copper, showing a dimple;

FIG. 3 shows a schematic cross-sectional representation of a trench filled with copper in a photoresist;

FIG. 4 shows a cross-sectional photograph through a BMV that is filled with copper;

FIG. 5 shows a filled BMV and a filled trench (comparative test);

FIG. 6 shows a filled BMV and a filled trench (test according to the invention).

Background To All Tests

Equipment: Cornell cell 1.8 liters; bath movement using pump; no air blown in.

Bath composition: 50 g/l Cu$^{2+}$ (as copper sulfate); 150 g/l H$_2$SO$_4$; 45 mg/l or (as sodium chloride); 100 mg/l Fe$^{2+}$ (as iron (II) sulfate); 300 mg/l PEG 10,000; 0.1 ml/l of a solution of a sulfur containing brightener; 0-3 mg/l leveler.

Plating parameters: 2 A cell current; 67 min plating time; 90 min @ 2 A; dummy plating before start of the test to work-in the bath.

Board parameters: FR4 test printed circuit board, size 620 mm×457 mm, 1.5 mm thick, with four layers with through holes and BMVs in groups with the variables: through holes 10 (diameter): 250 µm (position A): BMVs 5a, 5b: (diameter× depth) 150 µm×60 µm (position B), 150 µm×80 µm (position C), 125 µm×80 µm (position C), 100 µm×80 µm (position C) (see FIG. 1b: overall view and detail views: upper left-hand corner: view FIG. 1b1, upper right-hand corner; view FIG. 1b2); total number: 6480 BMVs, 1728 through holes; asymmetrical design of board with (from the top) 5 µm copper cladding (α), 60 µm prepreg (β), 18 µm copper (γ), 1500 µm FR4-core (δ), 18 μm copper (ε), 80 μm prepreg (ζ) and 5 μm copper cladding (η) (see FIG. 1a).

EXAMPLE 1 OF THE INVENTION

Leveller: $NH_2$-Gly-Leu-OH

The printed circuit boards were coated with copper with different leveler content in the bath. First of all a test was carried out without leveler for comparison purposes. Then tests according to the invention were carried out with increasing leveler content. The evaluation was effected by removing micro-sections at a previously defined position on the printed circuit board. The dimple was used as a measurement for the filling of a BMV. FIG. 2 shows the determining of this test parameter in a schematic manner: The wall of a BMV made electrically conductive by means of conventional methods is given the numeral 1. This conductive layer merges on the surface of the adjoining photoresist layer 2 into a plated surface 3, for example a conductor path. The base of the plating in the BMV is in electrical contact with a copper layer 4. The BMV is filled with copper 5 using the method according to the invention. However, a top region 6 is not filled with copper (dimple).

The following variables are determined (parameters A1, A2, A3, B1 and depth can be found in FIG. 2).

Hole wall flattening=(1−(average of $A1$ and $A2$)/$A3$)×100

Throwing(minimum)=$B1$/(average of $A1$ and $A2$)×100

Fill ratio=$B1$/(depth+(average of $A1$ and $A2$)×100

A1 and A2 are determined at a spacing of 15 μm from the hole edge.

The ski slope of the copper surface in a filled trench can be found in FIG. 3. A channel 7 in a photoresist 8 is shown here. The bottom half of the channel is filled with copper 9. This copper 9 is in electrical contact with a copper layer 4.

The following variable is determined (parameters a and b are to be found in FIG. 3).

Ski slope[%]=(($b−a$)/$a$)×100

FIG. 4 shows a cross-sectional view through a BMV through a hole with a diameter of 100 μm after the board has been plated. The concentration of the leveler $NH_2$-Gly-Leu-OH was 0.3 mg/l.

EXAMPLE 2 OF THE INVENTION $NH_2$-Gly-Leu-OH exhibits BMV filling characteristics. In contrast to conventional levelers, however, the amino acids and peptides never cause a ski slope. This advantageous effect can be used to selectively influence the line shape in the baths for the filling of BMVs without impairing the BMV filling. To investigate the line shape a test board was coppered, said board having channels as produced by photoresists. The said channels were filled with copper under the specified conditions, $NH_2$-Gly-Leu-OH, as specified in Example 1 of the Invention, being used as the leveler. The copper layer grew uniformly and formed a rectangular structure 2 in the trench (FIG. 6).

This is not observed, however, with conventional levelers that are usually used for filling vias. For a comparative test of this type, $NH_2$-Gly-Leu-OH was not used as leveler but rather an Atotech Cupracid® HL bath with BMV filling characteristics. In this case, a concave deposition shape was observed (FIG. 5). This concave deposition shape is very disadvantageous for the subsequent process steps of a printed circuit board (CMP method) and consequently should be avoided by all means.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. An aqueous, acid bath for the electrolytic deposition of copper, said bath containing at least one copper ion source, at least one acid ion source, at least one brightener compound and at least one leveler compound, wherein said at least one leveler compound is a synthetically produced functionalized peptide, wherein said functionalized peptide is a peptide functionalized with at least one moiety selected from the group consisting of polyalkylene glycol groups, polyalkylene imine groups and polyvinyl alcohol groups, and wherein said functionalized peptide contains, at the C terminus thereof, an end amino acid, which is selected from the group consisting of leucine, isoleucine, methionine, phenylalanine, tryptophan, asparagine, glutamine, thyronine, lysine, arginine and histidine.

2. The aqueous, acid bath for the electrolytic deposition of copper according to claim 1, wherein the at least one leveler compound does not comprise diglycine, triglycine, polyglycine and carnosine (beta-alanyl-L-histidine).

3. The aqueous, acid bath for the electrolytic deposition of copper according to claim 1, wherein at least one of the polyalkylene glycol groups and the polyalkylene imine groups have the general chemical formula —(X—CHR—$CH_2)_n$—R', wherein X is O or NH, R is H or methyl, each X and each R in a (X—CHR—$CH_2$) moiety can be selected independently of each X and R in another (X—CHR—$CH_2$) moiety, wherein further n is an integer of from about 2 to about 1000 and R' is H, alkyl or aryl.

4. The aqueous, acid bath for the electrolytic deposition of copper according to claim 3, wherein —(X—CHR—$CH_2)_n$—R' is selected from the group consisting of homo-polyethylene glycol radicals, homo polypropylene glycol radicals, homo polyethylene imine radicals and copolymer radicals comprising at least two units, selected from the group consisting of ethylene glycol units, propylene glycol units and ethylene imine units.

5. The aqueous, acid bath for the electrolytic deposition of copper according to claim 4, wherein the copolymer radicals are formed from block copolymers, comprising said ethylene glycol units and said propylene glycol units.

6. The aqueous, acid bath for the electrolytic deposition of copper according to claim 3, wherein —(X—CHR—$CH_2)_n$—R' has a mean molecular weight of from about 300 to about 35,000 Dalton.

7. The aqueous, acid bath for the electrolytic deposition of copper according to claim 3, wherein n is from about 20 to about 500.

8. The aqueous, acid bath for the electrolytic deposition of copper according to claim 3, wherein R' is selected from the group consisting of H, $C_1$-$C_8$-alkyl and $C_5$-$C_{12}$-aryl.

9. The aqueous, acid bath for the electrolytic deposition of copper according to claim 1, wherein said peptide is selected from oligopeptides, containing from about 2 to about 10 amino acid units.

10. The aqueous, acid bath for the electrolytic deposition of copper according to claim 1, wherein said functionalized peptide contains at least one beta-amino acid, which is selected from the group consisting of beta-alanine, beta-phenyl alanine, beta-tryptophan, beta-thyrosine, beta-leucine, beta-isoleucine, beta-glutamine, beta-glutamine acid, beta-histidine, beta-methionine and asparagine acid.

11. The aqueous, acid bath for the electrolytic deposition of copper according to claim 1, wherein said at least one brightener compound is selected from the group consisting of organic thiol compounds, organic sulfide compounds, organic disulfide compounds and organic polysulfide compounds.

12. The aqueous, acid bath for the electrolytic deposition of copper according to claim 1, wherein said at least one leveler compound is present in a concentration of 0.01 mg/l to 1000 mg/l and wherein said at least one copper ion source is present in a concentration of 20 g/l to 250 g/l.

13. The aqueous, acid bath for the electrolytic deposition of copper according to claim 12, wherein said at least one copper ion source includes one or more copper salts.

14. The aqueous, acid bath for the electrolytic deposition of copper according to claim 13, wherein said one or more copper salts include copper sulfate.

15. The aqueous, acid bath for the electrolytic deposition of copper according to claim 12, wherein said at least one copper ion source consists of copper sulfate.

16. A method for the electrolytic deposition of copper on a work piece, said method comprising: (i) providing said aqueous, acid bath for the electrolytic deposition of copper in accordance with claim 1 and at least one anode, (ii) bringing said work piece and at least one anode into contact with said aqueous, acid bath and (iii) generating an electric current flow between said work piece and said at least one anode so that the copper is deposited on the work piece.

17. The method for the electrolytic deposition of copper in accordance with claim 16, wherein said work piece is a printed circuit board, a chip carrier or a semiconductor wafer.

18. The method for the electrolytic deposition of copper in accordance with claim 17, wherein the copper is deposited in trenches and blind micro vias of the printed circuit board, the chip carrier or the semiconductor wafer.

* * * * *